United States Patent [19]

Traa

[11] Patent Number: 4,866,314

[45] Date of Patent: Sep. 12, 1989

[54] PROGRAMMABLE HIGH-SPEED DIGITAL DELAY CIRCUIT

[75] Inventor: Einar O. Traa, Portland, Oreg.

[73] Assignee: Tektronix, Inc., Beaverton, Oreg.

[21] Appl. No.: 248,290

[22] Filed: Sep. 20, 1988

Related U.S. Application Data

[63] Continuation of Ser. No. 887,582, Jul. 18, 1986, abandoned.

[51] Int. Cl.⁴ .......................... H03K 5/13; H03K 17/28
[52] U.S. Cl. ..................................... 307/603; 307/608; 328/55
[58] Field of Search ........................... 328/55, 58, 147; 307/455, 511, 608, 265, 268, 494; 330/254, 262, 257, 261

[56] References Cited

U.S. PATENT DOCUMENTS

| 4,456,887 | 6/1984 | Tokumo | 330/261 |
| 4,617,523 | 10/1986 | Taylor | 330/261 |
| 4,675,562 | 6/1987 | Herlein et al. | 328/55 |
| 4,795,923 | 1/1989 | Dobos | 307/605 |
| 4,797,586 | 1/1989 | Traa | 307/603 |

Primary Examiner—Stanley D. Miller
Assistant Examiner—Timothy P. Callahan
Attorney, Agent, or Firm—Peter J. Meza; Paul S. Angello

[57] ABSTRACT

A high-speed electrical circuit (10) provides an output signal that is a delayed version of a digital input signal. The circuit includes two subcircuits (20 and 22) which receive the input signal and whose outputs (52 and 56) are summed together. The subcircuits provide two different paths for the digital input signal to travel, one path providing a long time delay and the other path providing a short time delay. Each of the subcircuits comprises a pair of emitter-coupled transistors (24 and 26; 28 and 30). The subcircuit providing the long delay time includes transistors which have large areas and collector resistors that promote relatively slow transistor switching response time. The subcircuit providing the short delay time is optimized for high speed operation. An externally applied control signal controls the relative amounts of current flowing through the emitters of the pairs of emitter-coupled transistors and thereby controls the proportion of the delay time effected on the digital input signal by each of the slow and fast paths. The total time delay provided by the circuit ranges from that of the slow path to that of the fast path. The control signal provides a means to maintain the desired amount of delay time should it change in response to changes in temperature.

2 Claims, 1 Drawing Sheet

PROGRAMMABLE HIGH-SPEED DIGITAL DELAY CIRCUIT

This is a continuation of application Ser. No. 06/887,582 filed July 18, 1986 and now abandoned.

BACKGROUND OF THE INVENTION

The present invention relates to signal delaying circuitry and, in particular, to a high-speed time delay circuit that uses an externally applied signal to control with high precision the delay time of a digital signal.

To operate properly, high-speed integrated circuits often require precise timing of many signals to achieve coincident transitions between logic states. Transitions between logic states of high-speed signals occur at different times because of differences in signal path lengths and in signal propagation delay times of the integrated circuit elements.

One way of achieving the precise timing of a "late" signal and an "early" signal is to delay the "early" signal by an amount of sufficient duration that aligns the logic transitions of the signals. Such alignment can be accomplished by passing the "early" signal through a series of circuit elements that have fixed propagation delays. This expedient suffers from the disadvantage of requiring the use of redundant circuitry that occupies extra space on power. Moreover, the delay provided is of a fixed amount and is susceptible to propagation delay changes that result from temperature variations. The result is that a small propagation delay deviation is multiplied by the presence of the several delay-producing circuit elements in the series.

SUMMARY OF THE INVENTION

An object of the present invention is, therefore, to provide a high-speed circuit that controls with high precision the delay time of a digital signal.

Another object of the invention is to provide such a circuit which can be fabricated as part of an integrated circuit, occupies a minimum amount of space, and consumes a minimum amount of power.

A further object of the invention is to provide such a circuit whose delay time is adjustable and thereby can be compensated for changes in delay time that result from temperature variations and circuit parameter differences.

The present invention is a high-speed electrical circuit that provides an output signal which is a delayed version of a digital input signal. The circuit includes two delay subcircuits which receive the input signal and whose outputs are summed together. The subcircuits provide two different paths for the input signal to travel, one path providing a long time delay and the other path providing a short time delay.

In a preferred embodiment, the first delay subcircuit, which provides a long time delay, comprises a pair of emitter-coupled transistors that have relatively large areas and use extra collector resistors. Transistors having large areas and extra collector resistors promote a relatively slow transistor switching response time by Miller multiplication of the capacitance between their respective base and collector regions. The second delay subcircuit, which provides a short time delay, comprises a pair of emitter-coupled transistors that have areas of nominal size and use no extra collector resistors.

An externally applied DC control signal controls the relative amounts of current flowing through the emitters of the pairs of emitter-coupled transistors and thereby controls the proportion of delay time effected on the digital input signal by each of the slow and fast paths. The total time delay provided by the circuit ranges from that of the slow path to that of the fast path. The control signal sets the delay time developed by the circuit and provides a means to maintain the delay time at the desired amount.

Additional objects and advantages of the present invention will be apparent from the following detailed description of a preferred embodiment thereof, which proceeds with reference to the accompanying drawing.

DETAILED DESCRIPTION OF A PREFERRED EMBODIMENT

Figure 1:
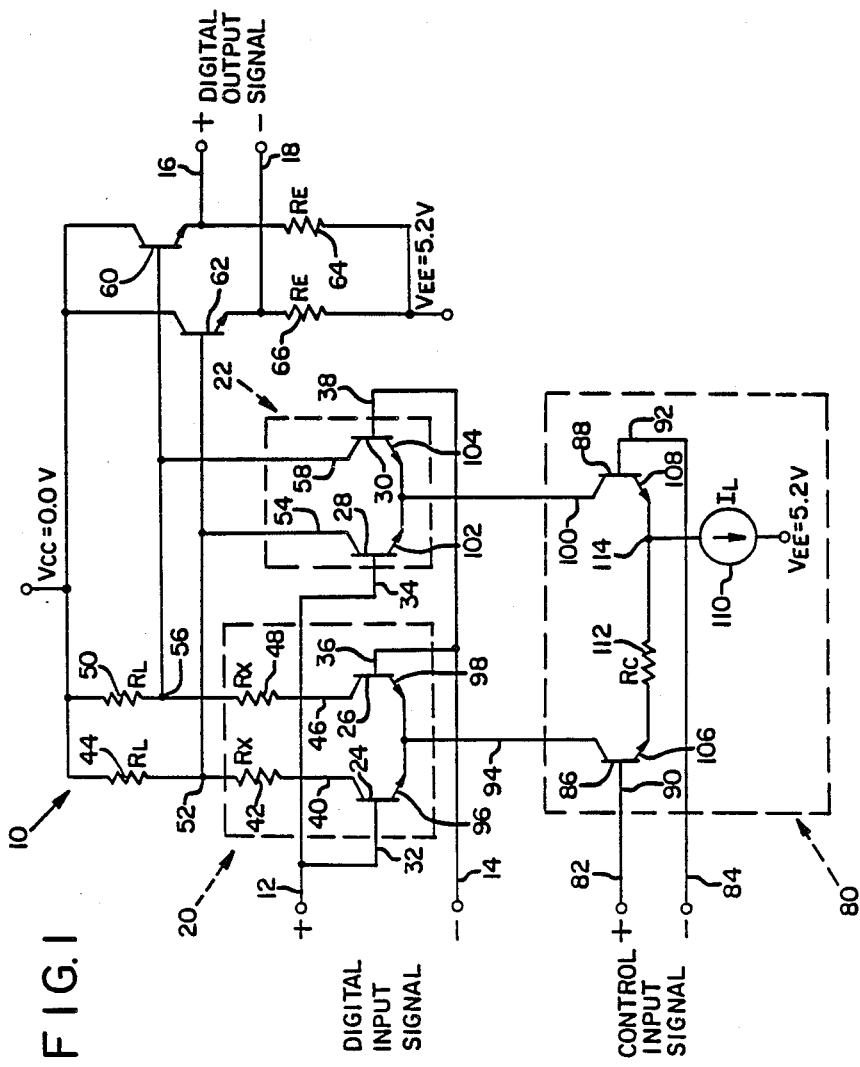
FIG. 1 is an electrical circuit schematic diagram of the delay circuit of the present invention.

With reference to FIG. 1, the delay circuit 10 receives across its input terminals 12 and 14 a differential voltage, $V_I$, and provides across its output terminals 16 and 18 a differential output voltage, $V_O$, that represents a delayed version of the input signal $V_I$. The input signal is preferably a high-speed digital signal of, for example, the emitter-coupled logic (ECL) type.

Delay circuit 10 comprises a first or "slow" delay subcircuit 20 and a second or "fast" delay subcircuit 22 whose inputs and outputs are connected together. Subcircuit 20 and subcircuit 22 comprise a pair of emitter-coupled NPN transistors 24 and 26 and a pair of emitter-coupled NPN transistors 28 and 30, respectively. The base terminals 32 and 34 of the respective transistors 24 and 28 are connected together to form a positive input to which input terminal 12 is connected. The base terminals 36 and 38 of the respective transistors 26 and 30 are connected together to form a negative input to which input terminal 14 is connected.

The collector terminal 40 of transistor 24 is connected to resistors 42 and 44, which are connected in series. The collector terminal 46 of transistor 26 is connected to resistors 48 and 58, which are connected in series. Each of the resistors 42 and 48 has the same resistance value, $R_X$, and contributes to the delay provided by subcircuit 20 as will be further described below. Each of the resistors 44 and 50 has a resistance value, $R_L$, and functions as a load resistor for the collector terminals of the transistors included in subcircuits 20 and 22. Resistors 44 and 50 are connected to the collector bias supply voltage, $V_{CC}$, which for ECL circuitry is typically zero volts.

The junction node 52 between resistors 42 and 44 is connected to the collector 54 of transistor 28 to form a negative output which is buffered and connected to output terminal 18. The junction node 56 between resistors 48 and 50 is connected to the collector 58 of transistor 30 to form a positive output which is buffered and connected to output terminal 16. Junction nodes 52 and 56 constitute summing points or means for the outputs of subcircuits 20 and 22. Subcircuits 20 and 22 form switching circuits with differential outputs on which versions of the input signal appear with delay times of different amounts. The output signal of circuit 10 has a total delay that is, therefore, synthesized by the summing of the output signals of subcircuits 20 and 22.

A pair of transistors 60 and 62 configured as emitter followers provide a buffering function for the signals appearing on the respective output terminals 16 and 18. An emitter bias supply voltage, $V_{EE}$, which for ECL circuitry is typically −5.2 volts, is applied to the emitters of transistors 60 and 62 through the respective resistors 64 and 66. Each of the resistors 64 and 66 has a resistance value, $R_E$, which provides the necessary bias currents for proper ECL circuit operation. The collectors of transistors 60 and 62 are connected to $V_{CC}$.

The amounts of current flowing through transistors 24 and 26 of subcircuit 20 and transistors 28 and 30 of subcircuit 22 are controlled by a control subcircuit or means 80 which receives an externally applied differential DC voltage control signal across a positive input terminal 82 and a negative input terminal 84. Control subcircuit 80 determines the relative proportion of the delay effected by subcircuits 20 and 22 on the digital input signal and, therefore, controls the overall delay of such signal.

Control subcircuit 80 includes NPN transistor 86, whose base terminal 90 is connected to input terminal 82, and NPN transistor 88, whose base terminal 92 connected to input terminal 84. The collector terminal 94 of transistor 86 provides a sink for the current flowing through the emitters 96 and 98 of the respective transistors 24 and 26 of subcircuit 20. The collector terminal 100 of transistor 88 provides a sink for the current flowing through the emitters 102 and 104 of the respective transistors 28 and 30 of subcircuit 22. The total current flowing through the emitter terminals 106 and 108 of the respective transistors 86 and 88 is of a constant amount, $I_L$, and is provided by a controlled constant-current source 110 of conventional design. A resistor 112 having a resistance value, $R_C$, is connected between emitter terminal 106 and the junction node 114 of emitter 108 and constant-current source 110. Resistor 112 causes a greater proportion of the current $I_L$ to flow through emitter 108 of transistor 88 when the control signal provides a potential difference of zero volts across input terminals 82 and 84. Control circuit 80 functions to control the amount of delay effected on the digital input signal in the following manner.

Whenever the potential difference of the control signal increases the base-to-emitter voltage of transistor 86, the amount of current flowing through collector 94 of transistor 86 increases and the amount of current flowing through collector 100 of transistor 88 decreases. This has the effect of increasing the portion of the digital input signal traveling through slow subcircuit 20 and decreasing the portion of the input signal traveling through fast delay subcircuit 22. The net effect is to increase the total delay time of the digital input signal. Whenever the potential difference of the control signal 84 increases the base-to-emitter voltage of transistor 88, the amount of current flowing through collector 94 of transistor 86 decreases and the amount of current flowing through collector 100 of transistor 88 increases. This has the effect of decreasing the portion of the digital input signal traveling through slow delay subcircuit 20 and increasing the portion of the digital input signal traveling through fast delay subcircuit 22. The net effect is to decrease the total delay time of the digital input signal. Since the total current flowing through collector 94 of transistor 86 and through collector 100 of transistor 88 remains constant substantially independent of the level of the control signal voltage, a change in the control signal voltage results only in a reproportioning of the total current flowing through subcircuits 20 and 22.

Subcircuit 20 provides a longer delay path for the digital input signal for two reasons. First, transistors 24 and 26 are fabricated with relatively large areas that provide them with a relatively large amount of capacitance between their collector and base regions. On the other hand, the areas of transistors 28 and 30 are selected for maximum speed. Second, resistors 42 and 48 contribute to the delay effected by transistors 24 and 26 by reason of Miller multiplication of the capacitance between the collector and the base of each of transistors 24 and 26.

The externally applied control signal provides an adjustment for programming the desired amount of delay of the digital input signal by changing the proportion of the input signal traveling through subcircuits 20 and 22. The total amount of delay circuit 10 is capable of providing ranges from between the delay provided by fast subcircuit 22 and the delay provided the slow subcircuit 20.

Table I presents typical values of the components shown in FIG. 1 for a circuit 10 that is designed with each of transistors 24 and 26 having an area that is four times greater than that of each of transistors 28 and 30.

TABLE I

| $R_L$ = 200 ohms | $R_E$ = 4 kilohms |
|---|---|
| $R_X$ = 600 ohms | $I_L$ = 1 mA |
| $R_C$ = 1 kilohm | |

The sum of the values $R_L$ and $R_X$ should not exceed an amount that would bias transistors 24 and 26 into saturation. The circuit described above is designed to delay a digital input signal of the ECL type by about two nanoseconds. This delay time can be held constant by changing the voltage level of the control signal that is applied across input terminals 82 and 84. Additional delay time can be provided in subcircuit 20 by positioning resistors into the base leads of the respective transistors 24 and 26.

It will be obvious for those having skill in the art that many changes may be made to the details of the above-described preferred embodiment of the present invention without departing from the underlying principles thereof. For example, a number of the above-described circuits 10 can be connected in series to provide longer delay times with a programming capability. The scope of the present invention should be determined, therefore, only by the following claims.

I claim:

1. A variable delay circuit for providing an output signal that is a delayed version of an input signal, comprising a first, slow delay subcircuit and a second, fast delay subcircuit coupled to receive an input signal to be delayed, a control circuit means for providing a constant current and for selectively proportioning said constant current between said first and second delay subcircuits, each subcircuit in response thereto providing corresponding first and second intermediate output signals representative of the input signal but delayed by a predetermined amount, and means for summing the intermediate output signals from the first and second delay subcircuits to provide a final output signal that corresponds to the input signal but that is delayed by an amount based on the proportion of said constant current supplied to each delay subcircuit by the control circuit, wherein each of said delay subcircuits comprises a pair of similar transistors each having a base, a collector, and an emitter, the bases receiving the input signal, the emitters being coupled together to receive a proportion of the constant current from the control circuit, and the current flowing in the collectors forming the intermediate output signal for the respective delay subcircuit, and wherein the emitters of the first delay subcircuit transistors are fabricated to have emitter areas larger than those of the second delay subcircuit transistors.

2. The circuit of claim 1, wherein said means for summing comprises a pair of load resistors coupled to the collectors of said first and second delay subcircuit transistors, which resistors receive the first and second intermediate output signal currents.

* * * * *